(12) United States Patent
Xu

(10) Patent No.: US 8,689,063 B2
(45) Date of Patent: Apr. 1, 2014

(54) JTAG APPARATUS AND METHOD FOR IMPLEMENTING JTAG DATA TRANSMISSION

(75) Inventor: Hua Xu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 185 days.

(21) Appl. No.: 13/386,417

(22) PCT Filed: Jul. 21, 2010

(86) PCT No.: PCT/CN2010/075372
§ 371 (c)(1),
(2), (4) Date: Jan. 21, 2012

(87) PCT Pub. No.: WO2011/009409
PCT Pub. Date: Jan. 27, 2011

(65) Prior Publication Data
US 2012/0272111 A1 Oct. 25, 2012

(30) Foreign Application Priority Data
Jul. 23, 2009 (CN) .......................... 2009 1 0089620

(51) Int. Cl.
*G01R 31/28* (2006.01)
(52) U.S. Cl.
USPC ............................ 714/712; 714/724; 714/733
(58) Field of Classification Search
USPC .................... 714/712, 727, 724, 726, 733, 30
See application file for complete search history.

(56) References Cited

U.S. PATENT DOCUMENTS

| 6,704,895 B1 * | 3/2004 | Swoboda et al. ............. 714/726 |
| 6,760,866 B2 * | 7/2004 | Swoboda et al. ............... 714/34 |
| 6,983,441 B2 * | 1/2006 | Wescott ........................ 716/117 |
| 2004/0001432 A1 | 1/2004 | Wescott |

FOREIGN PATENT DOCUMENTS

| CN | 201017277 Y | 2/2008 |
| CN | 101183139 A | 5/2008 |
| CN | 101621293 A | 1/2010 |
| WO | 0129666 A1 | 4/2001 |

OTHER PUBLICATIONS

International Search Report for PCT/CN2010/075372 dated Oct. 20, 2010.

* cited by examiner

*Primary Examiner* — Fritz Alphonse
(74) *Attorney, Agent, or Firm* — Ling Wu; Stephen Yang; Ling and Yang Intellectual Property

(57) ABSTRACT

A Joint Test Action Group (JTAG) apparatus and a method for implementing JTAG data transmission are disclosed. The JTAG apparatus includes an isolation circuit connected with a processor and pins of a JTAG programmable logic device, wherein the isolation circuit has a register/registers corresponding to the pins of the JTAG programmable logic device. Based on a high or low level signal written into the register/registers of the isolation circuit by the processor, the isolation circuit drives the pins of the JTAG programmable logic device, and transmits the JTAG data corresponding to the high or low level signal from the processor to the JTAG programmable logic device. The isolation circuit is used to implement protection of a JTAG interface or a serial port of a personal computer connected with the JTAG apparatus.

18 Claims, 2 Drawing Sheets

US 8,689,063 B2

JTAG APPARATUS AND METHOD FOR IMPLEMENTING JTAG DATA TRANSMISSION

TECHNICAL FIELD

The present invention relates to a technology of remotely online download of a programmable device through a Joint Test Action Group (JTAG) interface, and in particular, to a JTAG apparatus with an isolation circuit and a method for implementing a JTAG data transmission by the isolation circuit.

BACKGROUND OF THE RELATED ART

With the development of circuit technologies, the use of programmable devices is becoming more and more widespread. The programmable devices like a piece of paper or a pile of building blocks, and engineers can design a digital system freely through a traditional schematic input method or a hardware description language. The correctness of the design can be pre-verified through a software simulation. After implementing a Printed Circuit Board (PCB), online modification capabilities of the programmable device can further be used to modify the design at any time without modifying a hardware circuit. Developing digital circuits with the programmable devices can greatly shorten design time, reduce PCB area and improve reliability of the system.

A designer converts a function to be implemented into a form of a schematic diagram or the hardware description language, compiles it by a compiling software, and downloads the compiled program into the programmable devices through a JTAG interface, and the programmable devices will operate in accordance with an intent of the designer.

The JTAG is an international standard protocol, which is mainly used for a chip internal test and program download. Now, almost all of the programmable devices support the JTAG interface, and the programmable device with the JTAG interface is referred to as a JTAG programmable logic device. A standard JTAG interface includes the following pins:

JTAG_TMS: a mode selection pin;
JTAG_TCK: a clock pin;
JTAG_TDI: a data input pin;
JTAG_TDO: a data output pin;
JTAG_RST_N: a JTAG reset pin.

At present, the common method for downloading by the JTAG programmable logic devices is:

Using a JTAG download cable to connect a serial port of a PC (computer) and the JTAG interface of the JTAG programmable logic device, running a JTAG download software on the PC, and downloading a compiled file of the programmable device which has been compiled into the JTAG programmable logic device through the JTAG download cable. The commonly-used JTAG download method mainly has the following defects:

A. as the JTAG interface does not support hat plug, after the download is implemented, if the JTAG download cable is directly unplugged from the JTAG connector of the JTAG programmable logic device, the JTAG interface is very easy to be damaged, leading to the JTAG programmable logic device not performing subsequent program upgrade functions;

B. the JTAG download requires to directly connect the serial port of the PC and the JTAG interface of the JTAG programmable logic device through the JTAG download cable; as the JTAG apparatus where the JTAG interface is located is possibly not grounded or not well grounded, leading to that a large amount of static electricity is accumulated on the apparatus, and when the JTAG programmable logic device of the apparatus performs the download through the JTAG download cable, the large amount of static electricity accumulated on the JTAG apparatus will be transmitted to the serial port of the PC through the JTAG interface, and eventually burn out the serial port of the PC, leading to that the download can not be performed;

C. in addition, the upgrade is comparatively troubled, and if the JTAG apparatus which is already put on the market and is sold to a user is required to upgrade the JTAG programmable logic devices, related staff needs to hold the JTAG download cable to the site of the apparatus to be tested of the user, open the apparatus to be tested, and then connect the JTAG connector connected with the JTAG download cable to the JTAG apparatus and the PC respectively, and manually download an upgrade program, which is liable to affect normal operations of the JTAG apparatus of the customer, and is time-consuming and laborious and extremely inconvenient.

SUMMARY OF THE INVENTION

The technical problem to be solved by the present invention provides a JTAG apparatus and a method for implementing JTAG data transmission, which prevents a JTAG interface or a serial port of a personal computer (PC) connected with the JTAG apparatus from being damaged by using an isolation circuit to implement protection for a JTAG interface or the serial port.

In order to solve the above technical problem, the technical scheme of the present invention is implemented as follows:

a JTAG apparatus, comprising a processor and a JTAG programmable logic device, wherein, the JTAG apparatus further comprising:

an isolation circuit connected with the processor and pins of the JTAG programmable logic device, wherein, the isolation circuit has a register/registers corresponding to the pins of the JTAG programmable logic device; and based on a high or low level signal written into the register/ registers of the isolation circuit by the processor, the isolation circuit drives the pins of the JTAG programmable logic device, and transmits the JTAG data to which the high or low level signal corresponds from the processor to the JTAG programmable logic device.

The JTAG programmable logic device comprises a data input pin, a mode selection pin, a clock pin and a reset pin: and the isolation circuit comprises registers corresponding to the data input pin, the mode selection pin, the clock pin and the reset pin respectively.

the isolation circuit comprises:

the programmable logic device, having registers corresponding to the data input pin, the mode selection pin, the clock pin and the reset pin respectively; and an optical coupler, connected with the programmable logic device, and connected with the data input pin, the mode selection pin, the clock pin and the reset pin of the JTAG programmable logic device respectively.

The optical coupler comprises:

a CATHODE pin, an ANODE pin, a VO pin, a GND pin, a VCC pin and a VE pin; wherein, the VCC pin is connected with the VE pin, and a pull-up resistor is connected between the VE pin and the VO pin;

the CATHODE pin is connected with the register to which the data input pin corresponds and the VO pin is connected with the data input pin; or the CATHODE pin is connected with the register to which the mode selection pin corresponds and the VO pin is connected with the mode selection pin; or the CATHODE pin is connected with the register to which the clock pin corresponds and the VO pin is connected with the clock pin; or the CATHODE pin is connected with the register to which the reset pin corresponds and the VO pin is connected with the reset pin, when an input of the CATHODE pin is a high level signal, a diode between the ANODE pin and the CATHODE pin and a diode between the VO pin and the GND pin are both in cut-off state, and the data input pin, the mode selection pin, the clock pin or the reset pin is pulled to a level of the VCC pin through the pull-up resistor to transmit the high level signal to the JTAG programmable logic device; and when the input of the CATHODE pin is a low level signal, the diode between the ANODE pin and the CATHODE pin and the diode between the VO pin and the GND pin are both in on state, and the data input pin, the mode selection pin, the clock pin or the reset pin is pulled to a level of the GND pin through the pull-up resistor to transmit the low level signal to the JTAG programmable logic device.

The programmable logic device further comprises: a register to which a data output pin corresponds; and the optical coupler is further connected with the data output pin.

When the input of the CATHODE pin is a high level signal, the register to which the data output pin corresponds is pulled to the VCC pin through the pull-up resistor to store the high level signal into the register to which the data output pin corresponds;

when the input of the CATHODE pin is a low level signal, the register to which the data output pin corresponds is pulled to the GND pin through the pull-up resistor to store the low level signal into the register to which the data output pin corresponds.

The pins of the JTAG programmable logic device correspond to one register, and each pin of the JTAG programmable logic device corresponds to one bit in the register respectively; or each pin of the JTAG programmable logic device corresponds to one register respectively.

A frequency of a signal which is permitted to pass the optical coupler is greater than a download frequency of the JTAG programmable logic device; and/or the programmable logic device specifically is a General Purpose Input/Output (GPIO) expander or a Complex Programmable Logic Device (CPLD).

The isolation circuit specifically is a data isolation circuit which implements isolation using a capacitor.

The JTAG apparatus further comprises: an Ethernet chip with an Ethernet port, wherein, the Ethernet chip is connected with the processor, and is used to transmit JTAG data received by the Ethernet port to the processor; and the processor is used to download the JTAG data into the JTAG programmable logic device through the isolation circuit.

A method for implementing JTAG data transmission by an isolation circuit, which is applied to a JTAG apparatus including a JTAG programmable logic device and a processor, wherein, the method comprises:

the isolation circuit acquiring a high or low level signal written into the register/registers of the isolation circuit by the processor, to which pins of the JTAG programmable logic device correspond; and based on the high or low level signal, the isolation circuit driving the pins of the JTAG programmable logic device, and downloading the JTAG data to which the high or low level signal corresponds from the processor into the JTAG programmable logic device.

The method further comprises: the isolation circuit inputting the high or low level signal of the pins of the JTAG programmable logic device into the register/registers, and waiting for reading by the processor.

Before the processor writing the high or low level signal into the register/registers, the method further comprises: an Ethernet chip with an Ethernet port transmitting the JTAG data received by the Ethernet port to the processor.

The beneficial effects of the above technical scheme of the present invention are as follows:

in the above scheme, the isolation circuit is used to isolate the pins of the JTAG programmable logic device, which can prevent the problem of burning out the serial port of the PC because the static electricity accumulated on the JTAG apparatus is transmitted to the serial port due to the JTAG apparatus not being grounded or not being well grounded; further, after performing the isolation on the JTAG programmable logic device by using the isolation circuit, even though a JTAG download cable is hot plugged, the JTAG interface will not be damaged due to the protection of the isolation circuit.

Further, remote download and real-time download can be implemented without performing manual download by opening the JTAG apparatus on the site of customers, which is safe and reliable.

PREFERRED EMBODIMENTS OF THE PRESENT INVENTION

In order to make technical problems to be solved by the present invention, technical schemes and advantages more clear, the present invention will be described in detail in conjunction with accompanying drawings and specific embodiments hereinafter.

The present invention provides isolation on a JTAG interface of a JTAG programmable logic device in a JTAG apparatus, and implements protection on the JTAG interface or a serial port of a PC connected with the JTAG apparatus, thus preventing the JTAG interface or the serial port from being damaged for a problem that the JTAG interface or the serial port of the PC connected with the JTAG apparatus is easy to be burned out when being used because the JTAG apparatus accumulates a large amount of static electricity.

Figure 1:
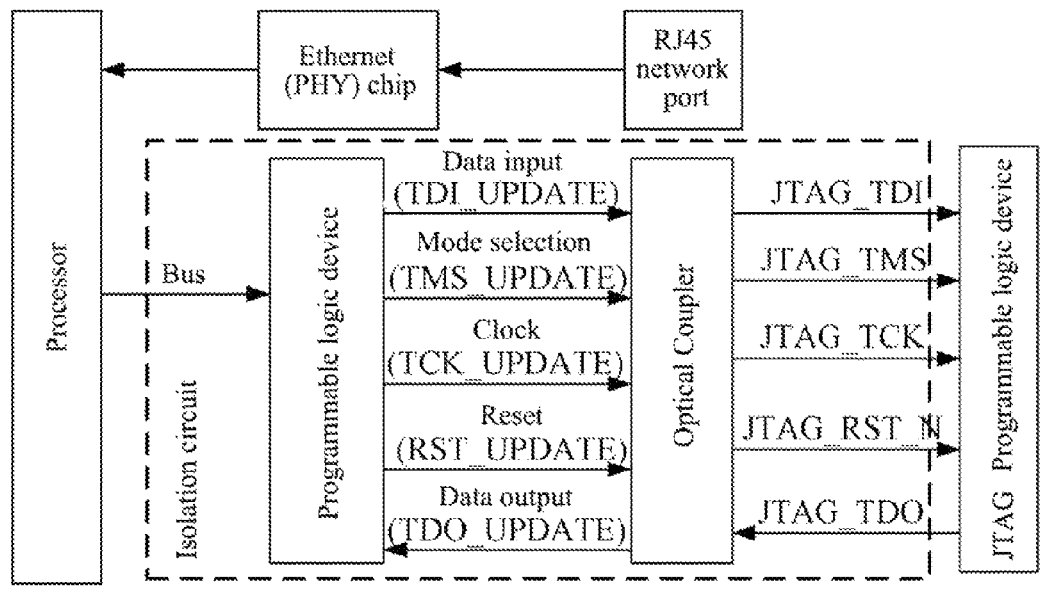
FIG. 1 is a specific structural diagram of a JTAG apparatus according to an embodiment of the present invention.

As shown in FIG. 1, a JTAG apparatus of an embodiment of the present invention comprises:

a processor, which can be a CPU of the JTAG apparatus and is used to implement various logic processing of the JTAG apparatus;

a JTAG programmable logic device, which is used to implement software upgrade of the JTAG apparatus or implement an extended function;

an isolation circuit, which is connected with the e processor and pins of the JTAG programmable logic device, wherein the isolation circuit has a register/registers corresponding to the pins of the JTAG programmable logic device; and the pins of the JTAG programmable logic device are JTAG interfaces;

based on a high or low level signal written into the register/registers of the isolation circuit by the processor, the isolation circuit drives the pins of the JTAG programmable logic device, and transmits the JTAG data to which the high or low level signal corresponds from the processor to the JTAG programmable logic device.

in the embodiment, by adding the isolation circuit in the JTAG apparatus, the processor firstly writes a read/write level signal of the JTAG programmable logic device into the register/registers of the isolation circuit according to the JTAG bus timing which is simulated by the processor, so that the JTAG programmable logic device determines the JTAG bus read/write timing through the isolation circuit, the isolation circuit drives the pins of the JTAG programmable logic device according to the high or low level signal written into the register/registers by the processor when the processor writes data into the JTAG programmable logic device, and finally transmits the JTAG data to which the high or low level signal corresponds to the JTAG programmable logic device, so as to implement protection of the pins of the JTAG programmable logic device, i.e., the JTAG interfaces, thus preventing the JTAG interface or the serial port of the PC connected with the JTAG apparatus from being damaged. The processor can implement the JTAG download by performing a write operation on the JTAG programmable logic device.

In addition, the isolation circuit inputs the high or low level signal of the pins of the JTAG programmable logic device into the register/registers when the processor reads data from the JTAG programmable logic device, and waits for reading by the processor;

wherein, the above pins of the JTAG programmable logic device includes: a data input pin JTAG_TDI, a mode selection pin JTAG_TMS, a clock pin JTAG_TCK, a reset pin JTAG_RST_N and a data output pin JTAG_TDO;

accordingly, the isolation circuit includes: a register corresponding to the data input pin JTAG_TDI, the mode selection pin JTAG_TMS, the clock pin JTAG_TCK, the reset pin JTAG_RST_N or the data output pin JTAG_TDO. The register can be one register, with each pin of the JTAG programmable logic device corresponding to one bit of the register respectively, such as a 8-bit register, (which is not limited to the 8-bit register, it can also be a 16-bit register), and the 5 pins of the JTAG programmable logic device respectively correspond to one bit of the 8-bit register, and the driving of corresponding pin of the JTAG programmable logic device can be implemented by only operating the corresponding bit in the 5 bits. Of course, it can also be one pin corresponding to one register, for example, the register to which the data input pin JTAG_TDI corresponds is TDI_UPDATE; the register to which the mode selection pin JTAG_TMS corresponds is TMS_UPDATE; the register to which the clock pin JTAG_TCK corresponds is TCK_UPDATE; the register to which the reset pin JTAG_RST_N corresponds is RST_UPDATE; and the register to which the data output pin JTAG_TDO corresponds is TDO_UPDATE, and the driving of the corresponding pin of the JTAG programmable logic device is implemented by operating the corresponding register.

Wherein, the above isolation circuit includes:

a programmable logic device, having registers corresponding to the data input pin JTAG_TDI, the mode selection pin JTAG_TMS, the clock pin JTAG_TCK, the reset pin JTAG_RST_N or the data output pin JTAG_TDO respectively;

an Optical Coupler (OC), connected with the programmable logic device and connected with the data input pin JTAG_TDI, the mode selection pin JTAG_TMS, the clock pin JTAG_TCK, the reset pin JTAG_RST_N and the data output pin JTAG_TDO of the JTAG programmable logic device respectively.

The OC is a high speed OC, and a frequency of the signal which is permitted to pass should be greater than a download frequency of the JTAG programmable logic device, to satisfy the download requirements of the JTAG programmable logic device, for example, the maximum frequency of the OC is 1 MHZ.

In addition, the above programmable logic device can specifically ease a General Purpose Input/Output (GPIO) expander for simulation, or can be a Complex Programmable Logic Device (CPLD).

The OC uses light as a media to transmit an electrical signal, and have a good isolation effect on input and output signals, and the primary principle is converting the input electrical signal into an optical signal, and then converting the optical signal into an electrical signal, so as to play an input and output isolation role. As the input and the output of the OC are isolated with each other, the transmission of the electrical signal has characteristics such as one-way etc., and thus has good electrical insulation capability and anti-interference capability.

The OC includes:

A CATHODE pin, an ANODE pin, a VO pin, a GND pin, a VCC pin and a VE pin; wherein, the VCC pin is connected with the VE pin, and a pull-up resistor is connected between the VE pin and the VO pin;

the CATHODE pin is connected with a register/registers to which the data input pin JTAG_TDI corresponds, and the VO pin is connected with the data input pin JTAG_TDI, or, the CATHODE pin is connected with a register/registers to which the mode selection pin JTAG_TMS corresponds, and the VO pin is connected with the mode selection pin JTAG_TMS, or, the CATHODE pin is connected with a register/registers to which the clock pin JTAG_TCK corresponds, and the VO pin is connected with the clock pin JTAG_TCK, or, the CATHODE pin is connected with a register/registers to which the reset pin JTAG_RST_N corresponds, and the VO pin is connected with the reset pin JTAG_RST_N, or, the CATHODE pin is connected with a register/registers to which the data output pin JTAG_TDO corresponds, and the VO pin is connected with a register/registers to which the data output pin JTAG_TDO corresponds.

when an input of the CATHODE pin is a high level signal, a diode between the ANODE pin and the CATHODE pin and a diode between the VO pin and the GND pin are in cut-off state, and the data input pin JTAG_TDI, the mode selection pin JTAG_TMS, the clock pin JTAG_TCK or the reset pin JTAG_RST_N is pulled to a level of the VCC pin through the pull-up resistor to transmit the high level signal to the JTAG programmable logic device; or the register/registers to which the data output pin JTAG_TDO corresponds is/are pulled up to level of the VCC pin through the pull-up resistor, to store the high level signal into the register/registers to which the data output pin JTAG_TDO corresponds;

when the input of the CATHODE pin is a low level signal, the diode between the ANODE pin and the CATHODE pin and the diode between the VO pin and the GND pin are in on state, and the data input pin JTAG_TDI, the mode selection pin JTAG_TMS, the clock pin JTAG_TCK or the reset pin JTAG_RST_N is pulled to a level of the GND pin through the pull-up resistor to transmit the low level signal to the JTAG programmable logic device; the register/registers to which the data output pin JTAG_TDO corresponds is/are pulled up to the GND pin through the pull-up resistor, to store the low level signal into the register/registers to which the data output pin JTAG_TDO corresponds.

Figure 2:
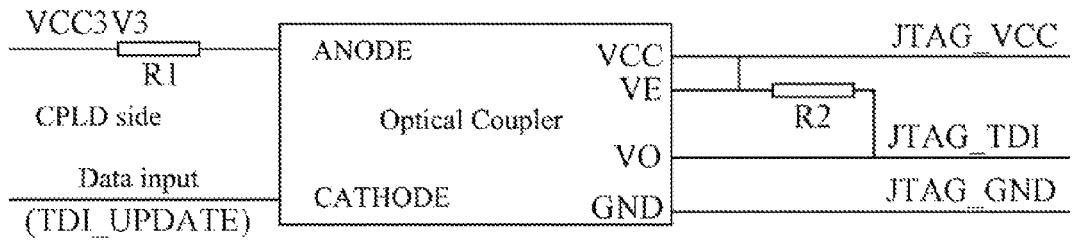
FIG. 2 is a diagram of an operational principle of an isolation circuit implementing isolation of a data input pin of a JTAG programmable logic device in the JTAG apparatus illustrated in FIG. 1.

The operation relationship between each pin of the above OC and each pin of the JTAG programmable logic device as well as the register/registers in the programmable logic device will be described hereinafter in conjunction with the specific accompanying drawings:

As shown in FIG. 2, a diagram of optical isolation of a data input pin JTAG_TDI is illustrated, and the operational principle is as follows:

the JTAG_TDI is a data input pin of the JTAG programmable logic device, and the corresponding register/registers TDI_UPDATE is/are driven by the CPLD implementing the programmable logic device, and the high or low level of the TDI_UPDATE is implemented by writing a value, i.e., "1" or "0" into register/registers TDI_UPDATE of the CPLD by the processor, and is decided by data needed to be written into the JTAG programmable logic device by the processor. The register/registers TDI_UPDATE can be one bit of the register, or can be an independent register. When the TDI_UPDATE is a high level, the input of the CATHODE pin of the OC is a high level signal, and a diode between the ANODE pin and the CATHODE, pin is in cut-off state, and the VO pin and the GND pin of the OC are also in cut-off state, leading to the JTAG TDI being pulled to a JTAG_VCC through the pull-up resistor R2 and also being a high level, and thus the high level signal is transmitted to the JTAG_TDI of the JTAG programmable logic device through the OC. When the TDI_UPDATE is a low level, the input of the CATHODE pin of the OC is a low level signal, and the diode between the ANODE pin and the CATHODE pin is in on state, and the VO pin and the GND pin of the OC are also in on state, so that the JTAG_TDI is connected to the JTAG_GND pin, and the level of the JTAG_TDI is a low level, and thus the low level signal is transmitted to the JTAG_TDI of the JTAG programmable logic device through the OC. The above process implements the input of the download data of the JTAG interface of the JTAG programmable logic device.

Figure 3:
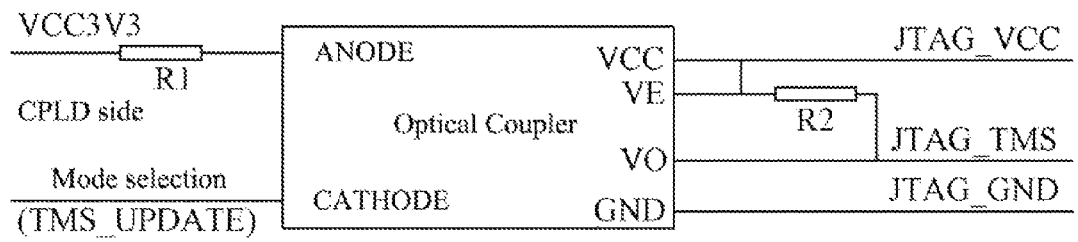
FIG. 3 is a diagram of an operational principle of an isolation circuit implementing isolation of a mode selection pin of a JTAG programmable logic device in the JTAG apparatus illustrated in FIG. 1.

As shown in FIG. 3, a diagram of photoelectric isolation of a mode selection pin JTAG_TMS is illustrated, and an operational principle is shown as follows:

The OC is a high speed OC, and a frequency of the signal which is permitted to pass can be 1 MHZ, which totally satisfies a download frequency of the JTAG programmable logic device. The JTAG_TMS is a mode selection pin of the JTAG programmable logic device, and the corresponding register/registers TMS_UPDATE is/are driven by the CPLD implementing the programmable logic device. The high or low level of the TMS_UPDATE is implemented by writing a value, i.e., "1" or "0" into the register/registers TMS_UPDATE of the CPLD by the processor, and is decided by data needed to be written into the JTAG programmable logic device by the processor. The register/registers TMS_UPDATE can be one bit of the register, or can be an independent register. When the TMS_UPDATE is a high level, the input of the CATHODE pin of the OC is a high level signal, and the diode between the ANODE pin and the CATHODE pin is in cut-off state, and the VO pin and the GND pin of the OC are also in cut-off state, leading to that the JTAG_TMS is pulled to the JTAG_VCC through the pull-up resistor R2 and is also a high level, and thus the high level signal is transmitted to the JTAG_TMS of the JTAG programmable logic device through the OC. When the TMS_UPDATE is a low level, the input of the CATHODE pin of the OC is a low level signal, and the diode between the ANODE pin and the CATHODE pin is in on state, leading to the VO pin and the GND pin of the OC being also in on state, so that the JTAG_TMS is connected to JTAG_GND pin, and the level of the JTAG_TMS is a low level, and thus the low level signal is transmitted to the JTAG_TMS of the JTAG programmable logic device through the OC. The above process implements mode selection of the JTAG interface of the JTAG programmable logic device.

Figure 4:
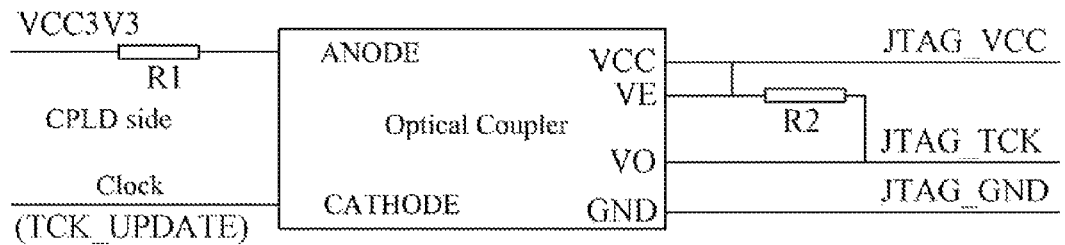
FIG. 4 is a diagram of an operational principle of an isolation circuit implementing isolation of a clock pin of a JTAG programmable logic device in the JTAG apparatus illustrated in FIG. 1.

As shown in FIG. 4, a diagram of photoelectric isolation of a clock pin JTAG_TCK is illustrated, and the operational principle is as follows:

the OC is a high speed OC, and a frequency of the signal which is permitted to pass can be 1 MHZ, Which totally satisfies a download frequency of the JTAG programmable logic device; the JTAG_TCK is a clock pin of the JTAG programmable logic device, and the corresponding register/registers TCK_UPDATE is/are driven by the CPLD implementing the programmable logic device, the high or low level of the TCK_UPDATE is implemented by writing a value, i.e., "1" or "0" into the register/registers TCK_UPDATE of the CPLD by the processor, and is decided by data needed to be written into the JTAG programmable logic device by the processor. The register/registers TCK_UPDATE can be one bit of the register, or can be an independent register. When the TCK_UPDATE is a high level, the input of the CATHODE pin of the OC is a high level signal, and the diode between the ANODE pin and the CATHODE pin is in cut-off state, and the VO pin and the GND pin of the OC are also in cut-off state, leading to the JTAG_TCK being pulled to the JTAG_VCC and also being a high level, and thus the high level signal is transmitted to the JTAG_TCK of the JTAG programmable logic device through the OC. When the TCK_UPDATE is a low level, the input of the CATHODE pin of the OC is a low level signal, and the diode between the ANODE pin and the CATHODE pin is in on state, leading to the VO pin and the GND pin being also in on state, so that the JTAG_TCK is connected to the JTAG_GND pin, and the level of the JTAG_TCK is a low level, and thus the low level signal is transmitted to the JTAG_TCK of the JTAG programmable logic device through the OC. The above process implements input of a clock of the JTAG interface of the JTAG programmable logic device.

Figure 5:
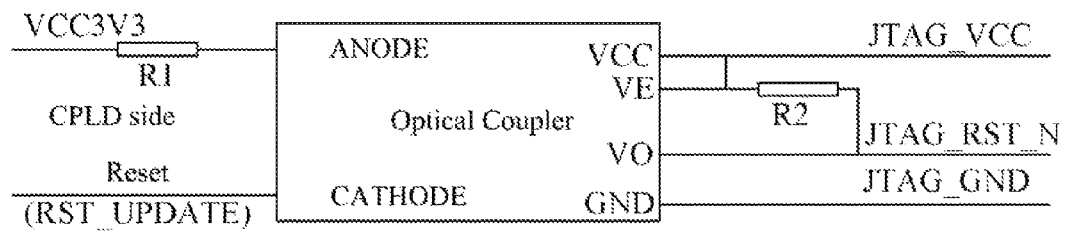
FIG. 5 is a diagram of an operational principle of an isolation circuit implementing isolation of a reset pin of a JTAG programmable logic device in the JTAG apparatus illustrated in FIG. 1.

As shown in FIG. 5, a diagram of photoelectric isolation of a reset pin JTAG_RST_N is illustrated, and the operational principle is as follows:

the OC is a high speed OC, and a frequency of the signal which is permitted to pass can be 1 MHZ, Which totally satisfies a download frequency of the JTAG programmable logic device; the JTAG_RST_N is a clock pin of the JTAG programmable logic device, and the corresponding register/registers RST_UPDATE is/are driven by the CPLD implementing the programmable logic device, the high or low level of the RST_UPDATE is implemented by writing a value, i.e., "1" or "0" into the register/registers RST_UPDATE of the CPLD by the processor, and is decided by data needed to be written into the JTAG programmable logic device by the processor. The register/registers RST_UPDATE can be one bit of the register, or can be an independent register. When the RST_UPDATE is a high level, the input of the CATHODE pin of the OC is a high level signal, and the diode between the ANODE pin and the CATHODE pin is in cut-off state, and the VO pin and the GND pin of the OC are also in cut-off state, leading to the JTAG_RST_N being pulled to the JTAG_VCC and also being a high level, and thus the high level signal is transmitted to the JTAQ_RST_N of the JTAG programmable logic device through the OC. When the RST_UPDATE is a low level, the input of the CATHODE pin of the OC is a low level signal, and the diode between the ANODE pin and the CATHODE pin is in on state, leading to the VO pin and the GND pin of the OC being also in on state, so that the JTAG_RST_N is connected to the JTAG_GND pin, and the level of the JTAG_RST_N is a low level, and thus the low level signal is transmitted to the JTAG_RST_N of the JTAG programmable logic device through the OC. The above process implements a reset operation of the JTAG interface of the JTAG programmable logic device.

Figure 6:
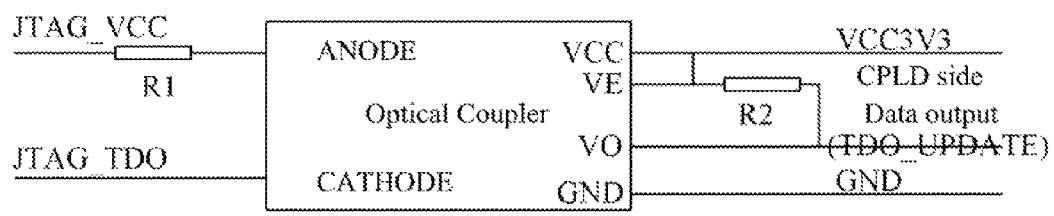
FIG. 6 is a diagram of an operational principle of an isolation circuit implementing isolation of a data output pin of a JTAG programmable logic device in the JTAG apparatus illustrated in FIG. 1.

As shown in FIG. 6, a diagram of photoelectric isolation of a data output pin JTAG_TDO is illustrated, and the operational principle is as follows:

the JTAG TDO is a data output pin of the JTAG programmable logic device, which corresponds to register/registers TDO_UPDATE in the CPLD implementing the programmable logic device. The register/registers TDO_UPDATE can be one bit of the register, or can be an independent register. When an output of the JTAG_TDO is a high level, the level between the ANODE pin and the CATHODE pin of the OC is a low level, and the diode between the ANODE pin and the CATHODE pin is in cut-off state, leading to the VO pin and the GND pin being in cut-off state, and the TDO_UPDATE is connected to VCC3V3 and thus is a high level, and the high level is inputted into the TDO_UPDATE of the CPLD and waits for reading by the processor. When the output of the JTAG_TDO is a low level, the diode between the ANODE pin and the CATHODE pin of the OC is in on state, leading to the VO pin and the GND pin of the OC being in on state, and the TDO_UPDATE is connected to GND and thus is a low level, and the low level is inputted into the TDO_UPDATE of the CPLD and waits for reading by the processor. The high or low level of the JTAG_TDO described above is decided by the data needed to be read by the processor in the JTAG programmable logic device.

The above circuits constitute the whole structure of the JTAG apparatus. The currently used JTAG download method basically downloads programs of a programmable device from a PC by using a JTAG download cable, which has three defects described in the background of the related art. The present invention uses a high speed OC to perform optical coupling isolation on the 5 pins in the JTAG programmable logic device respectively, which can prevent the problem of burning out a serial port because the static electricity accumulated on the JTAG apparatus is transmitted to the serial port of a PC due to the JTAG apparatus not being grounded or not being well grounded; further, after performing the isolation on the JTAG interfaces by using the OC, even though the download cable is hot plugged, the JTAG interface will not be damaged due to the protection of the OC.

In addition, as shown in FIG. 1 again, the JTAG apparatus of the present invention can further include an Ethernet chip of an Ethernet port, and the Ethernet chip is connected with the processor, and is used to transmit JTAG data received by the Ethernet port to the processor, and the processor downloads the JTAG data into the JTAG programmable logic device through the isolation circuit. Thus, the programs in the JTAG programmable logic device can be upgraded online, and the programs of the programmable logic device needed to be upgraded can be transmitted to the ROM of the processor of the JTAG apparatus through a network (for example, an Ethernet port such as RJ45 network port) for conservation. The processor simulates the JTAG timing by reading or writing a register/registers of the programmable logic device at a suitable time, downloads the programs of the programmable logic device needed to be upgraded into the JTAG programmable logic device through the programmable logic device, thus implementing remote download and real time download, without performing manual download by opening the JTAG apparatus on the site of customers, which is safe and reliable.

At last, in the above embodiments of the present invention, the isolation circuit can be implemented by using a digital isolation circuit, which performs isolation by using a capacitor, such as digital isolation circuits produced by ADI and TI companies.

The embodiment of the present invention further provides a method for implementing JTAG data download by an isolation circuit, applied to a JTAG apparatus having a JTAG programmable logic circuit and a processor, wherein, the method comprises:

Step 1: the isolation circuit acquiring a high or low level signal written into the register/registers of the isolation circuit by the processor, to which pins of the JTAG programmable logic device correspond; and Step 2: based on the high or low level signal, the isolation circuit driving the pins of the JTAG programmable logic device, and downloading the JTAG data to which the high or low level signal corresponds from the processor into the JTAG programmable logic device.

The specific implementation in the method performs isolation protection on the JTAG programmable logic device, and the method for implementing remote download is illustrated in the above accompanying drawings, which will not be further described here.

In conclusion, the processor drives 5 pins i.e., JTAG_TMS, JTAG_TCK, JTAG_TDO, JTAG_RST, JTAG_TDI according to the simulated timing and functions by the LocalBus performing reading or writing on the related register/registers (such as TMS_UPDATE, TCK_UPDATE, TDO_UPDATE, RST_UPDATE, TDI_UPDATE) of the isolation circuit, and then implements data transmission between the processor and the JTAG programmable logic device by transmitting data on the JTAG programmable logic device after the optical coupling isolation. Further, files to be downloaded can be transmitted remotely from the network to the processor through the RJ45 network port for conversation, and then be downloaded into the JTAG programmable logic device, so as to implement the remote download, without performing manual download by opening the JTAG apparatus on the site of customers, which is safe and reliable.

The above description is only the preferred embodiments of the present invention and it should be pointed out that for those of ordinary skill in the art, a number of modifications and polishes can be made without departing from the principle of the present invention. These modifications and polishes should also be considered as being within the protection scope of the present invention.

What is claimed is:

1. A Joint Test Action Group (JTAG) apparatus, comprising a processor and a JTAG programmable logic device, wherein, the JTAG apparatus further comprising:

an isolation circuit connected with the processor and pins of the JTAG programmable logic device, wherein, the isolation circuit has a register/registers corresponding to the pins of the JTAG programmable logic device;

based on a high or low level signal written into the register/registers of the isolation circuit by the processor, the isolation circuit drives the pins of the JTAG programmable logic device, and transmits JTAG data to which the high or low level signal corresponds from the processor to the JTAG programmable logic device.

2. The JTAG apparatus according to claim 1, wherein, the JTAG programmable logic device comprises a data input pin, a mode selection pin, a clock pin and a reset pin; and the isolation circuit comprises registers corresponding to the data input pin, the mode selection pin, the clock pin and the reset pin respectively.

3. The JTAG apparatus according to claim 2, wherein, the isolation circuit comprises:
a programmable logic device, having registers corresponding to the data input pin, the mode selection pin, the clock pin and the reset pin respectively; and
an optical coupler, connected with the programmable logic device, and connected with the data input pin, the mode selection pin, the clock pin and the reset pin of the JTAG programmable logic device respectively.

4. The JTAG apparatus according to claim 3, wherein, the optical coupler comprises:
a CATHODE pin, an ANODE pin, a VO pin, a GND pin, a VCC pin and a VE pin; wherein, the VCC pin is connected with the VE pin, and a pull-up resistor is connected between the VE pin and the VO pin;
the CATHODE pin is connected with the register to which the data input pin corresponds and the VO pin is connected with the data input pin; or
the CATHODE pin is connected with the register to which the mode selection pin corresponds and the VO pin is connected with the mode selection pin; or
the CATHODE pin is connected with the register to which the clock pin corresponds and the VO pin is connected with the clock pin; or
the CATHODE pin is connected with the register to which the reset pin corresponds and the VO pin is connected with the reset pin,
when an input of the CATHODE pin is a high level signal, a diode between the ANODE pin and the CATHODE pin and a diode between the VO pin and the GND pin are in cut-off state, and the data input pin, the mode selection pin, the clock pin or the reset pin is pulled to a level of the VCC pin through the pull-up resistor to transmit the high level signal to the JTAG programmable logic device; and
when the input of the CATHODE pin is a low level signal, the diode between the ANODE pin and the CATHODE pin and the diode between the VO pin and the GND pin are in on state, and the data input pin, the mode selection pin, the clock pin or the reset pin is pulled to a level of the GND pin through the pull-up resistor to transmit the low level signal to the JTAG programmable logic device.

5. The JTAG apparatus according to claim 4, wherein, a frequency of a signal which is permitted to pass the optical coupler is greater than a download frequency of the JTAG programmable logic device; and/or
the programmable logic device specifically is a General Purpose Input/Output (GPIO) expander or a Complex Programmable Logic Device (CPLD).

6. The JTAG apparatus according to claim 3, wherein, the programmable logic device further comprises: a register to which a data output pin corresponds; and the optical coupler is further connected with the data output pin.

7. The JTAG apparatus according to claim 6, wherein,
when the input of the CATHODE pin is a high level signal, the register to which the data output pin corresponds is pulled to the VCC pin through the pull-up resistor to store the high level signal in the register to which the data output pin corresponds; and
when the input of the CATHODE pin is a low level signal, the register to which the data output pin corresponds is pulled to the GND pin through the pull-up resistor to store the low level signal in the register to which the data output pin corresponds.

8. The JTAG apparatus according to claim 7, wherein, a frequency of a signal which is permitted to pass the optical coupler is greater than a download frequency of the JTAG programmable logic device; and/or
the programmable logic device specifically is a General Purpose Input/Output (GPIO) expander or a Complex Programmable Logic Device (CPLD).

9. The JTAG apparatus according to claim 3, wherein, a frequency of a signal which is permitted to pass the optical coupler is greater than a download frequency of the JTAG programmable logic device; and/or
the programmable logic device specifically is a General Purpose Input/Output (GPIO) expander or a Complex Programmable Logic Device (CPLD).

10. The JTAG apparatus according to claim 6, wherein, a frequency of a signal which is permitted to pass the optical coupler is greater than a download frequency of the JTAG programmable logic device; and/or
the programmable logic device specifically is a General Purpose Input/Output (GPIO) expander or a Complex Programmable Logic Device (CPLD).

11. The JTAG apparatus according to claim 2, wherein, the isolation circuit specifically is a data isolation circuit which implements an isolation using a capacitor.

12. The JTAG apparatus according to claim 1, wherein, the pins of the JTAG programmable logic device correspond to one register, and each pin of the JTAG programmable logic device corresponds to one bit in the register respectively; or each pin of the JTAG programmable logic device corresponds to one register respectively.

13. The JTAG apparatus according to claim 1, wherein, the isolation circuit specifically is a data isolation circuit which implements an isolation using a capacitor.

14. The JTAG apparatus according to claim 1, wherein, the JTAG apparatus further comprises: an Ethernet chip with an Ethernet port, wherein, the Ethernet chip is connected with the processor, and is used to transmit JTAG data received by the Ethernet port to the processor; and the processor is used to download the JTAG data into the JTAG programmable logic device through the isolation circuit.

15. A method for implementing Joint Test Action Group (JTAG) data transmission by an isolation circuit, applied to a JTAG apparatus including a JTAG programmable logic device and a processor, wherein, the method comprises:
the isolation circuit acquiring a high or low level signal written by the processor into the register/registers, to which pins of the JTAG programmable logic device correspond, of the isolation circuit; and
based on the high or low level signal, the isolation circuit driving the pins of the JTAG programmable logic device, and downloading the JTAG data to which the high or low level signal corresponds from the processor into the JTAG programmable logic device.

16. The method according to claim 15, wherein, the method further comprises:

the isolation circuit inputting the high or low level signal of the pins of the JTAG programmable logic device into the register/registers, and waiting for reading by the processor.

17. The method according to claim 16, wherein, before the processor writing the high or low level signal into the register/registers, the method further comprises: an Ethernet chip with an Ethernet port transmitting the JTAG data received by the Ethernet port to the processor.

18. The method according to claim 15, wherein, before the processor writing the high or low level signal into the register/registers, the method further comprises: an Ethernet chip with an Ethernet port transmitting the JTAG data received by the Ethernet port to the processor.

* * * * *